United States Patent [19]
Kashima et al.

[11] Patent Number: 5,889,294
[45] Date of Patent: Mar. 30, 1999

[54] EDGE EMITTING LED HAVING A SELECTIVE-AREA GROWTH OPTICAL ABSORPTION REGION

[75] Inventors: Yasumasa Kashima; Tsutomu Munakata, both of Tokyo, Japan

[73] Assignee: Oki Electric Industry Co., Ltd., Tokyo, Japan

[21] Appl. No.: 805,716

[22] Filed: Feb. 25, 1997

[30] Foreign Application Priority Data

Feb. 27, 1996 [JP] Japan .................................. 8-039348

[51] Int. Cl.$^6$ .................................................. H01L 27/15
[52] U.S. Cl. .......................... 257/80; 257/21; 257/81; 257/84; 257/85; 257/436
[58] Field of Search .......................... 257/14, 21, 22, 257/80, 82, 185, 84, 85, 436, 81; 372/50

[56] References Cited

U.S. PATENT DOCUMENTS 5,574,289  11/1996  Aoki et al. ................................ 257/17

FOREIGN PATENT DOCUMENTS 0 680 119 A  11/1995  European Pat. Off. .

OTHER PUBLICATIONS

Patterson, Bruce D., Epler, John E., Graf, Bruno, Lehmann, Hans W., and Sigg, Hans C., "A Superluminescent Diode at 1.3 μm with Very Low Spectral Modulation", Mar. 1994, IEEE Journal of Quantum Electronics, vol. 30, No. 3.

Kashima, Yasumasa, Matoba, Akio, and Takano, Hiroshi, "Linear InGaAsP Edge–Emitting LED's for Single–Mode Fiber Communications", Nov. 1992, Journal of Lightwave Technology, vol. 10, No. 11.

Osowski et al., "Broadband emission from InGaAs–GaAs–ALGaAs LED with integrated absorber by selective-area MOCVD", Electronics Letters, Aug. 17, 1995, UK, vol. 31, No. 17.

Patent Abstracts of Japan, vol. 018, No. 318(E–1562), 16 Jun 3 1994 & JP 06 069538 A (Oki Electric Ind. Co. Ltd.), Mar. 11, 1994 *abstract*, Yasumasa.

Patent Abstracts of Japan, vol. 014, No. 257 (E–0936), 4 Jun. 1990 & JP 02 077174 A (Toshiba Corp), Mar. 16, 1990 *abstract*, Akira.

*Primary Examiner*—Minh-Loan Tran
*Attorney, Agent, or Firm*—Rabin & Champagne, P.C.

[57] ABSTRACT

An edge emitting LED comprises a semiconductor substrate having a main surface, an active layer formed over the main surface, and the active layer having a light emitting region, an optical absorption region having a bandgap energy smaller than that of the light emitting region, and a composition change region formed between the light emitting region and the optical absorption region, the composition change region having the bandgap energy continuously changes. Accordingly, an edge emitting LED is able to produce a stable, spontaneous emission of a light under a wide range of operating conditions. Furthermore, a method of forming an edge emitting LED, comprising the steps of: providing a semiconductor substrate having a previous formation region of an active layer having a light emitting region and an optical absorption region continued with the light emitting region; forming a mask pattern over the substrate located on both sides of the optical absorption region; and forming the active layer over the formed structure. Accordingly, a method of forming a edge emitting LED is able to form a light emitting region and an optical absorption region, with one-step growth.

10 Claims, 7 Drawing Sheets

EDGE EMITTING LED HAVING A SELECTIVE-AREA GROWTH OPTICAL ABSORPTION REGION

CROSS REFERENCE TO RELATED APPLICATION

This application claims the benefit of priority of application Ser. No. 039348/1996, filed Feb. 27, 1996 in Japan, the subject matter of which is incorporated herein by reference.

BACKGROUND OF THE INVENTION

1. Field of the Invention

The present invention relates to an edge emitting LED (light emitting diode) and a fabrication method, paticuraly to an edge emitting LED having a selective-area growth optical absorption region.

2. Description of the Related Art

FIG. 6 is perspective cross sectional view showing a light emitting diode in accordance with the prior art.

Referring to FIG. 6, a prior art edge-emitting LED comprises a p-InP substrate 1, an n-InP block layer 2, a p-InP block layer 3, a p-InP cladding layer 4, active layers 5, 8, a p-InGaAsP light emitting region A, an n-InGaAsP contact layer 7, a p-InGaAsP optical absorption region B, and an SiO2 film 9.

The prior art edge emitting LED has an optical absorption region B separated from the light emitting region A and the InP block layer 6.

A backward light emitted in the light emitting region A is propagated to the InP block layer 6 with some radiation angles due to diffraction, through the optical absorption region B.

Then, the backward light combines with the optical absorption region B. Since an effective bandgap of the optical absorption region B is smaller than that of the light emitting region A, the light combined with the optical absorption region B decreases due to an optical absorption effect.

As a result, a very small amount light can reach to the back facets of the optical absorption region B and optical feedback to the light emitting region A can be avoided.

SUMMARY OF THE INVENTION

It is an object of the present invention to provide an edge emitting LED that is able to produce a stable, spontaneous emission of light under a wide range of operating conditions.

According to one aspect of the present invention, for achieving the above object, there is provided an edge emitting LED, comprising:

a semiconductor substrate having a main surface;

an active layer formed over the main surface; and the active layer having a light emitting region, an optical absorption region having a bandgap energy smaller than that of the light emitting region, and a composition change region formed between the light emitting region and the optical absorption region, the composition change region having the bandgap energy continuously changing.

According to another aspect of the present invention, for achieving the above object, there is provided an edge emitting LED, comprising:

a semiconductor substrate having a main surface;

an active layer formed over the main surface; and the active layer having a light emitting region, an optical absorption region having a thickness thicker than that of the light emitting region, and a composition change region formed between the light emitting region and the optical absorption region, the composition change region being of a continually changing thickness.

The present invention is also directed to a method of forming a light emitting diode.

It is an object of the present invention to provide a method of forming an edge emitting LED that is able to form a light emitting layer and an optical absorption layer with one-step growth.

According to one aspect of the present invention, for achieving the above object, there is provided a method of forming an edge emitting LED, comprising the steps of:

providing a semiconductor substrate having a previous formation region of an active layer having a light emitting region and an optical absorption region continued with the light emitting region;

forming a mask pattern over the substrate located on both sides of the optical absorption region; and forming the active layer over the formed structure.

BRIEF DESCRIPTION OF THE DRAWINGS

While the specification concludes with claims particularly pointing out and distinctly claiming the subject matter that is regarded as the invention, it is believed that the invention, along with the objects, features, and advantages thereof, will be better understood from the following description taken in connection with the accompanying drawings, in which:

DETAILED DESCRIPTION OF THE PREFERRED EMBODIMENTS

A. An Embodiment of an Edge Emitting LED

An embodiment of an edge emitting LED according to the present invention will hereinafter be described in detail with reference to the accompanying drawings.

Figure 1:
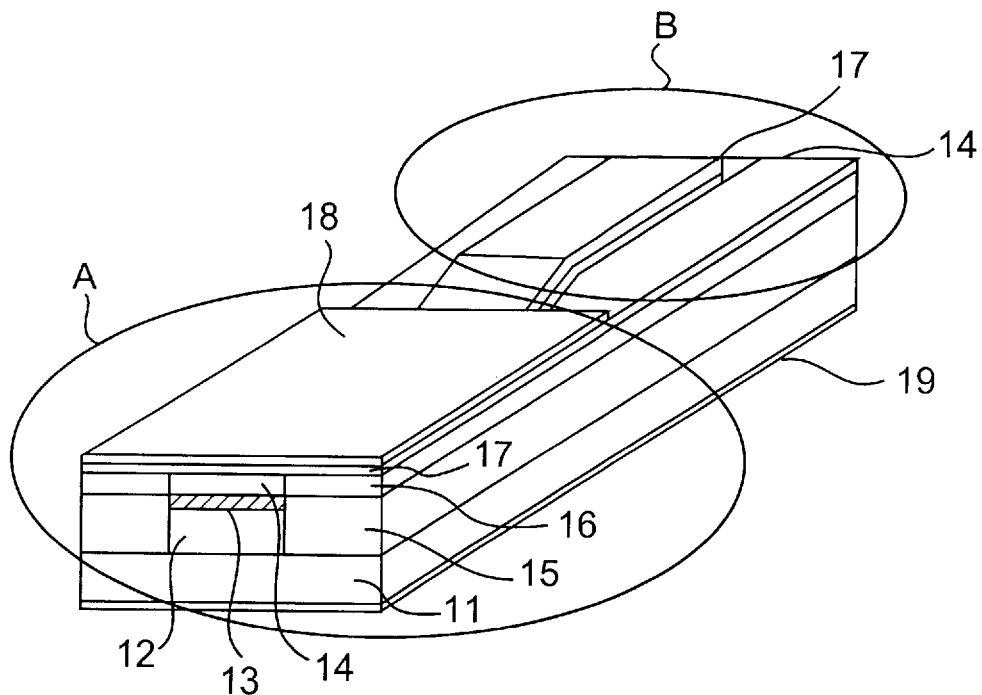
FIG. 1 is a perspective view showing an edge emitting LED according to an embodiment of the present invention.

FIG. 1 is a perspective view showing an edge emitting LED according to an embodiment of the present invention.

Figure 2:
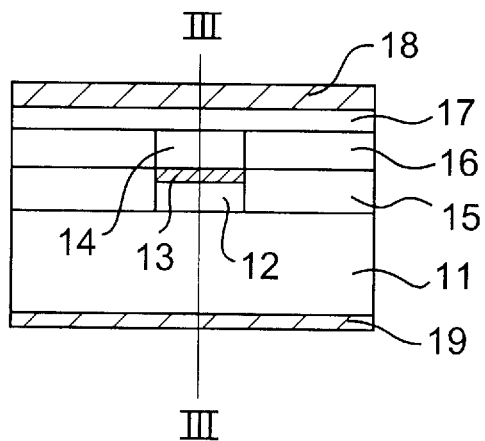
FIG. 2 is a cross sectional view showing an edge emitting LED according to an embodiment of the present invention.

FIG. 2 is a cross sectional view showing an edge emitting LED according to an embodiment of the present invention.

Figure 3:
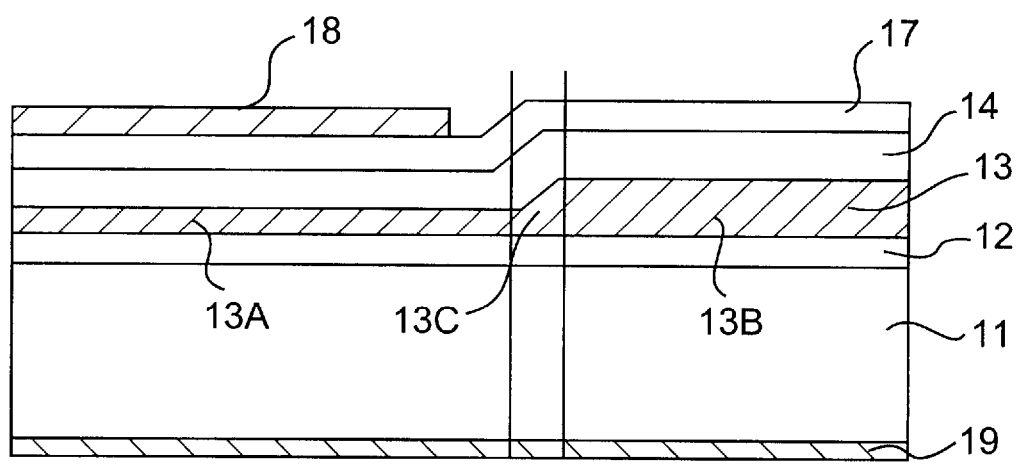
FIG. 3 is a cross sectional view taken on line A—A of FIG. 2.

FIG. 3 is a cross sectional view taken on line A—A of FIG. 2.

As shown in FIGS. 1 and 2, an edge emitting LED according to the present invention comprises an n-InP substrate 11, an n-InP cladding layer 12 formed on the n-InP substrate 11, an active layer 13 formed on the n-InP cladding layer 12, a p-InP cladding layer 14 formed on the active layer 13, first and second p-InP block layers 15 formed on the n-InP substrate 11 forming an optical confinement layer, a first n-InP block layer 16 formed on the first p-InP block layer 15, a second n-InP block layer 16 formed on the second p-InP block layer 15, a p-InGaAs contact layer 17 formed on the p-InP cladding layer 14 and the n-InP block layers 16, a p-electrode 18 formed on the p-InGaAs contact layer 17, and an n-electrode 19 formed under the n-InP substrate 11.

In this embodiment, the active layer 13 comprises a multiple quantum well layer having a stripe-geometry and is sandwiched between the first p-InP block layer 15 and the second p-InP block layer 15.

As shown in FIG. 3, the multiple quantum well layer 13 has a light emitting region 13A, an optical absorption region 13B and a composition change region 13C between the light emitting region 13A and the optical absorption region 13B.

The thickness of the optical absorption region 13B is thicker than that of the light emitting region 13A. The thickness and composition of the multiple quantum well layer 13 located in the composition change region 13C continuously changes from the light emitting region 13A to the optical absorption region 13B. Therefore, the optical absorption region 13B has a bandgap energy smaller than that of the light emitting region 13A, and the bandgap energy of the composition change region 13C continuously changes.

For the light emitting region 13A and the optical absorption region 13B a multiple quantum well layer 13 is adopted. The multiple quantum well layer 13 corresponding to the light emitting region 13A comprises seven pairs of a well layer having the bandgap energy of 1.38 $\mu$m and the thickness of 5 nm, and a barrier layer having the bandgap energy of 1.10 $\mu$m and the thickness of 10 nm.

The p-electrode 18 selectively is only located over the light emitting region 13A to confine a driving current to the emission regions.

A length of the p-electrode 18 in an extension direction of the multiple quantum well layer 13 is shorter than the light emitting region 13A. Therefore, the present invention is able to prevent a current from flowing into the optical absorption region 13C as a result of the current expanding.

Since the multiple quantum well layer 13 is burried in the p-InP block layer 15 and the n-InP block layer 16, very small emission spot size can be achieved.

An operation of the edge emitting LED, is:

When a current is injected to the multiple quantum well layer 13 of the edge emitting LED, a light is emitted at the light emitting region 13A.

A backward light propagates to the optical absorption region 13B.

Continuous refractive index change between the light emitting region 13A and the optical absorption region 13B prevents a reflection and a diffraction.

The backward light decreases by absorption because of a bandgap energy of the optical absorption region 13B.

Furthermore, since a composition of the optical absorption region 13B reduces a bandgap energy to the emittion wavelength, multiple reflections in the back facets of the optical absorption region 13B can be completely prevented.

Accordingly, an edge emitting LED of the present invention is able to produce a stable, spontaneous emission of light under a wide range of operating conditions.

B. An Embodiment of a Method of Forming an Edge Emitting LED.

The embodiment of a method of forming an edge emitting LED according to the present invention will hereinafter be described in detail with reference to FIG. 4.

FIG. 4 is a plane view and a cross sectional view showing an edge emitting LED according to a embodiment of the present invention for forming the edge emitting LED.

Figure 4A:
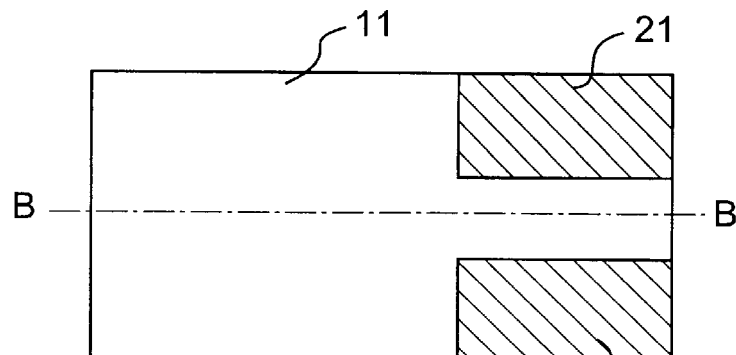
FIGS. 4A–4J are plane views and cross sectional views and a cross sectional views showing an edge emitting LED according to a embodiment of the present invention for forming the edge emitting LED.

The process for fabricating the edge emitting LED of the present invention is as follows:

As shown in FIG. 4A, the n-InP substrate 11 has a previous formation region of an active layer 13 having a light emitting region 13A and an optical absorption region 13B continued with the light emitting region 13A. In this embodiment, the active layer 13 comprises a InGaAsP/InGaAsP multiple quantum well structure.

First, a first mask pattern 21 (for example a dielectric film, SiO2) is selectively formed on the n-InP substrate 11 surface on both sides of the optical absorption region 13B.

Figure 4B:
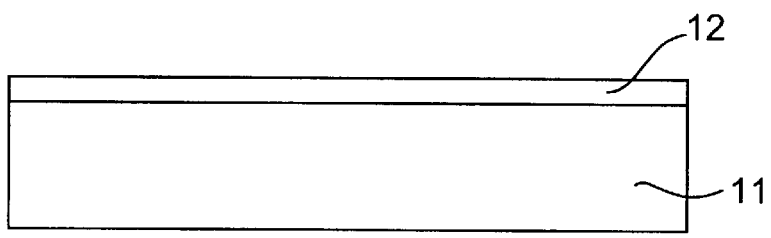

Then, as shown in FIG. 4B, an n-InP cladding layer 12 is formed on the n-InP substrate 11 as is the first mask pattern 21, using a metalorganic vapor phase epitaxial (MOVPE). The precursors for group III and V are trimethylindium and PH3, and the dopant is Si2H6.

Figure 4C:
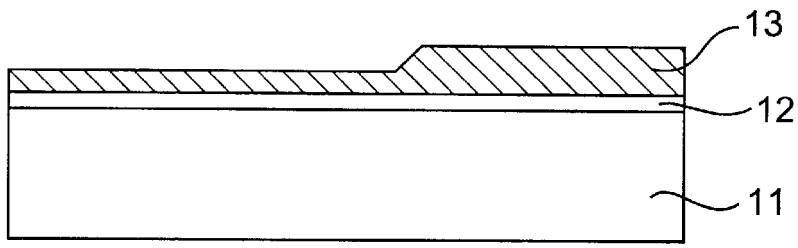

Then, as shown in FIG. 4C, an InGaAsP/InGaAsP multiple quantum well layer 13 is formed on the n-InP clad layer 12, using an MOVPE. The precursors for group III and V are trimethylindium, triethylgallium, AsH3 and PH3, the dopant is DMZn, and a typical growth velocity is 0.8 $\mu$m/hour and a growth temperature is 630° C. at 55 torr.

Figure 4D:
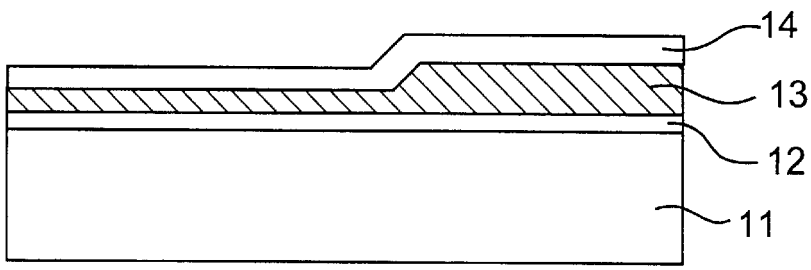

Then, as shown in FIG. 4D, a p-InP cladding layer 14 is formed on the multiple quantum well layer 13, using an MOVPE. The precursors for group III and V are trimethylindium and PH3 and the dopant is DMZn.

The process steps as shown in FIGS. 4A–4D are carried out with one-step MOVPE growth.

Figure 4E:
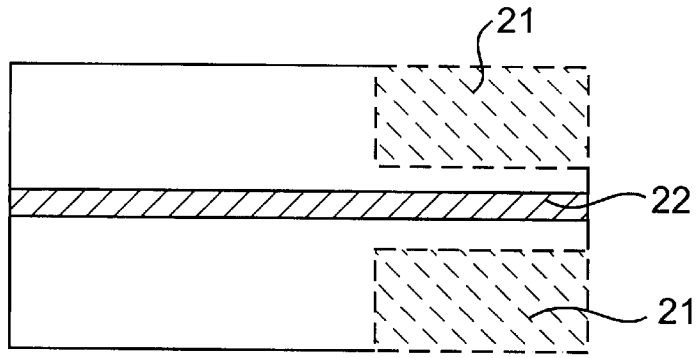

Then, as shown in FIG. 4E, the first mask pattern 21 is removed from the structure formed by the steps. Then, a second mask pattern 22 (for example a dielectric film, SiO2) is then selectively formed on the n-InP cladding layer 14 over the formation region. The shape of the second mask pattern 22 is a straight line. Then, the n-InP cladding layer 12, the multiple quantum well layer 13 and the p-InP cladding layer 14, is etched using the second mask pattern 22.

Figure 4F:
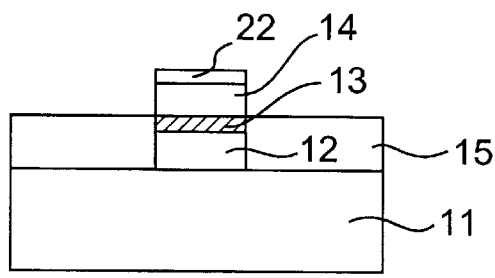

Then, as shown in FIG. 4F, a p-InP block layer 15 is formed on the n-InP substrate 11 in the removed portion, using an MOVPE. The precursors for group III and V are trimethylindium and PH3 and the dopant is DMZn.

Figure 4G:
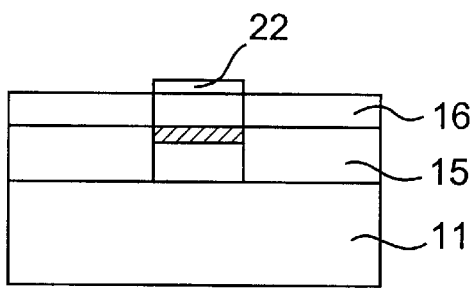

Then, as shown in FIG. 4G, an n-InP block layer 16 is formed on the p-InP block layer 15, using a MOVPE. The precursors for group III and V are trimethylindium and PH3, and the dopant is Si2H6.

Figure 4H:
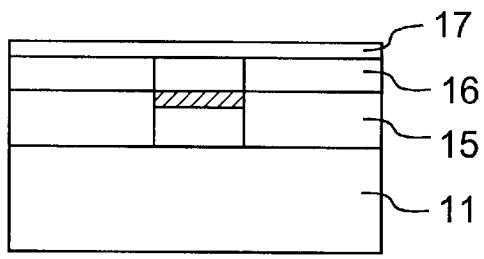

Then, as shown in FIG. 4H, the second mask pattern is removed from the structure formed by the steps. Then, a p-InGaAs contact layer 17 is formed on the p-InP clad layer 14 and the n-InP block layer 16, using an MOVPE. The precursors for group III and V are trimethylindium, triethylgallium and AsH3, and the dopant is DMZn.

Figure 4I:
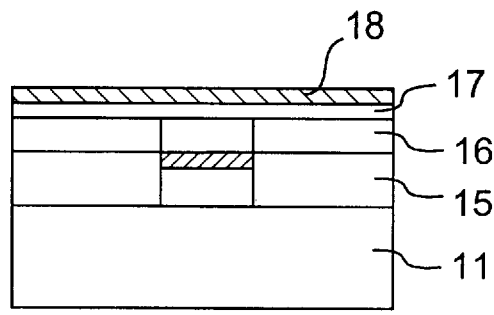

Then, as shown in FIG. 4I, the p-electrode 18 is selectively only formed on the p-InGaAs contact layer 17 over the light emitting region 13A to confine a driving current to the emission region.

Figure 4J:
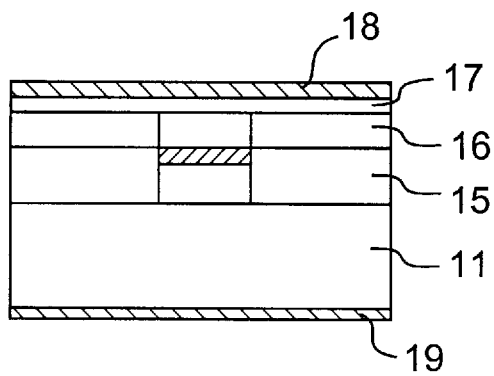

Then, as shown in FIG. 4J, the n-electrode 19 is formed under the n-InP substrate 11.

Figure 5:
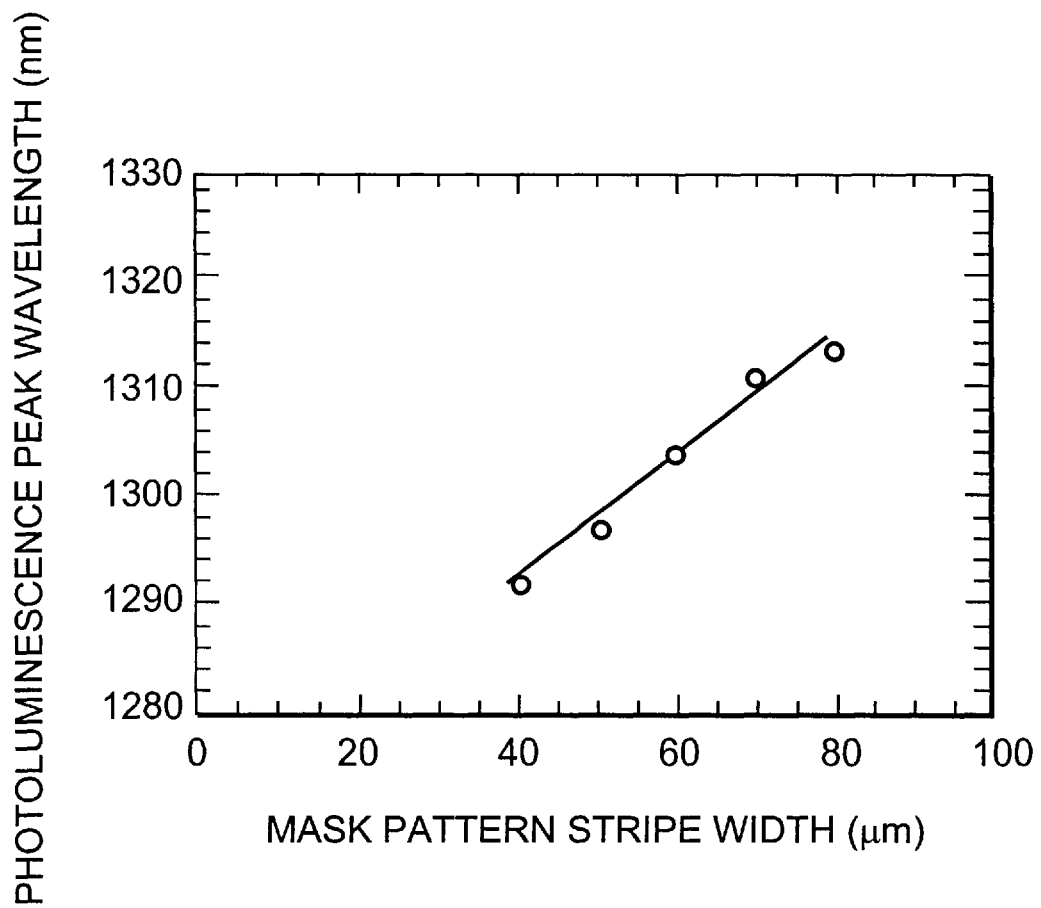
FIG. 5 is a diagram showing a photoluminescence peak wavelength versus a mask stripe width.
Figure 6:
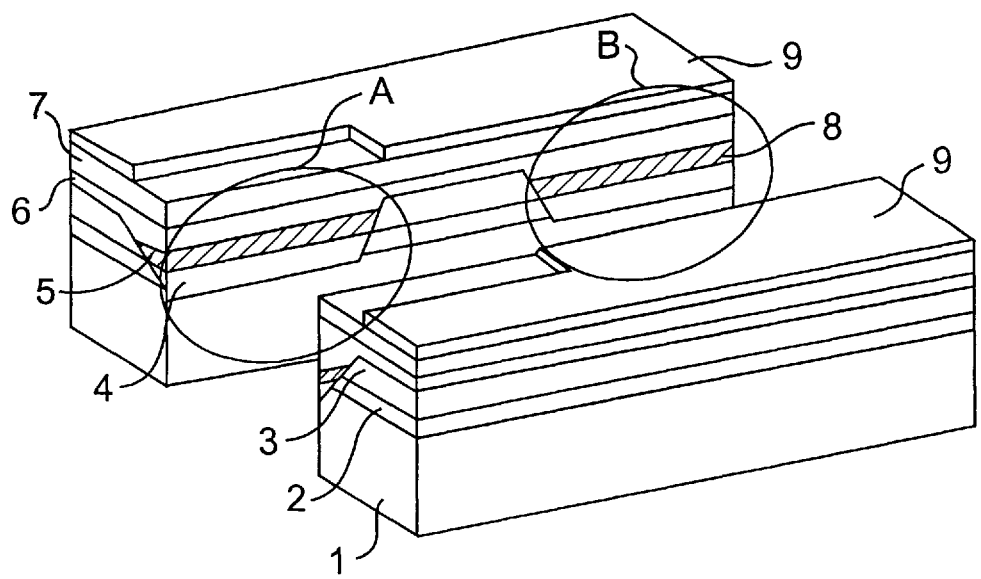
FIG. 6 is perspective cross sectional view showing an edge emitting LED in accordance with the prior art.

FIG. 5 shows dependence of a bandgap energy on a mask pattern stripe.

A method of forming a device for a measurement, as follows:

First, the n-InP substrate 11 has a first region and a second region continued with the first region. A mask pattern (for example a dielectric film, SiO2) is selectively formed on the n-InP substrate surface on both sides of the second region.

Then, an InGaAsP/InGaAsP multiple quantum well layer is formed on the n-InP substrate, using an MOVPE. The precursors for group III and V are trimethylindium, triethylgallium, AsH3 and PH3, the dopant is DMZn, and a typical growth velocity is 0.8 µm/hour and a growth temperature is 630° C. at 55 torr.

Measured data of the device is as follows:

(1) A photoluminesence peak wavelength of a multiple quantum well layer formed in the first region is 1280 nm.

A photoluminesence peak wavelength of a multiple quantum well layer formed in the second region is 1314 nm.

(2) A bandgap energy of a multiple quantum well layer formed in the second region is smaller than that of a multiple quantum well layer formed in the first region.

(3) a thickness of a multiple quantum well layer formed in the second region is thicker than that of a multiple quantum well layer formed in the first region.

That is, a multiple quantum well layer having a different photoluminesence peak wavelength/a different bandgap energy/a different thickness is selectively able to provide, with one-step growth, because of a mask pattern previously formed on the semiconductor substrate and after a multiple quantum well layer forms on the formed structure.

Accordingly, a bandgap energy of a multiple quantum well layer formed in the optical absorption region can be controlled to be smaller than that of a multiple quantum well layer formed in the light emitting region because the first region is applied to a light emitting region and the second region is applied to an optical absorption region.

Accordingly, the method of forming an edge emitting LED is capable of forming a light emitting region and an optical absorption region having deffering compositions and thickness, with one-step growth.

In this manner, the present invention applied selective growth to the optical absorption region of the multiple quantum well layer. The present invention applies control effective reflection at the back facet of the light emitting device. Specially, the present invention may be applied in order to reduce a reflection. The present invention is applied to the edge emitting LED of a buried hetero stripe structure. The present invention may be applied to a RWG structure, a DC-PBH structure, a BC structure, and a MTBH structure.

While the present invention has been described with reference to the illustrative embodiments, this description is not intended to be construed in a limiting sense. Various modifications of the illustrative embodiments, as well as other embodiments of the invention, will be apparent to those skilled in the art on reference to this description. It is therefore contemplated that the appended claims will cover any such modifications or embodiments as fall within the true scope of the invention.

What is claimed is:

1. An edge emitting LED having a selective-area growth optical absorption region, comprising:

a semiconductor substrate having a main surface and a back surface;

an active layer formed over the main surface, the active layer having a light emitting region, an optical absorption region having a bandgap energy smaller than that of the light emitting region, and a composition change region formed between the light emitting region and the optical absorption region, the composition change region having the bandgap energy continuously changing;

a first electrode formed over the back surface of the semiconductor substrate: and a second electrode formed on the light emitting region. the second electrode not formed on the optical absorption region and not formed on the composition chance region.

2. An edge emitting LED as claimed in claim 1, further comprising:

a first cladding layer formed over the main surface with the active layer being formed on the first cladding layer;

a second cladding layer formed on the active layer; and optical confinement layers sandwiching the active layer.

3. An edge emitting LED as claimed in claim 1, wherein the active layer has a multiple quantum well structure.

4. An edge emitting LED as claimed in claim 2, wherein the semiconductor substrate comprises a first conductive type InP, the first cladding layer comprises a first conductive type InP, the second cladding layer comprises a second conductive type InP, and the optical confinement layer comprises first and second InP block layers.

5. An edge emitting LED as claimed in claim 3, wherein the multiple quantum well structure comprises InGaAsP/InGaAsP.

6. An edge emitting LED having a selective-area growth optical absorption region, comprising:

a semiconductor substrate having a main surface and a back surface;

an active layer formed over the main surface, the active layer having a light emitting region, an optical absorption region having a thickness thicker than that of the light emitting region, and a composition change region formed between the light emitting region and the optical absorption region, the composition change region being of continuously changing thickness;

a first electrode formed over the back surface of the semiconductor substrate; and a second electrode formed on the light emitting region, the second electrode not formed on the optical absorption region and not formed on the composition change region.

7. An edge emitting LED as claimed in claim 6, further comprising:

a first cladding layer formed over the main surface;

the active layer formed on the first cladding layer;

a second cladding layer formed on the active layer; and optical confinement layers sandwiching the active layer.

8. An edge emitting LED as claimed in claim 6, wherein the active layer having a multiple quantum well structure.

9. An edge emitting LED as claimed in claim 7, wherein the semiconductor substrate comprises a first conductive type InP, the first cladding layer comprises a first conductive type InP, the second cladding layer comprises a second conductive type InP, and the optical confinement layer comprises first and second InP block layers.

10. An edge emitting LED as claimed in claim 8, wherein the multiple quantum well structure comprising InGaAsP/InGaAsP.

* * * * *